United States Patent
Kuo et al.

(10) Patent No.: US 6,384,656 B1
(45) Date of Patent: May 7, 2002

(54) STABLE FREQUENCY CLOCK GENERATOR

(75) Inventors: Jew-Yong Kuo, Hsinchu; Albert Sun, Taipei, both of (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 09/829,222

(22) Filed: Apr. 9, 2001

(30) Foreign Application Priority Data

Nov. 23, 2000 (TW) .......................................... 89124859

(51) Int. Cl.[7] .................................................. H03K 3/00
(52) U.S. Cl. ...................... 327/291; 327/294; 327/298; 327/276
(58) Field of Search ................................. 327/291, 294, 327/298, 299, 261, 276, 277, 284; 331/57

(56) References Cited

U.S. PATENT DOCUMENTS 4,882,505 A * 11/1989 Furman ...................... 327/291
5,424,690 A * 6/1995 Ohno ........................... 331/57
6,052,013 A * 4/2000 Kuo ............................ 327/333

* cited by examiner

Primary Examiner—Toan Tran
Assistant Examiner—An T. Luu
(74) Attorney, Agent, or Firm—J. C. Patents

(57) ABSTRACT

A fixed frequency clock generator generates and outputs a fixed frequency clock by using a number of fixed delay units and a number of inverters that both are connected in series alternately and evenly. More particularly, the fixed delay unit involves two fixed current sources and two controlling switchers, plus an inverter that controls a charging and a discharging of a capacitor. Then the electric potential of the capacitor and a stable voltage source respectively send the current to the comparator. The time of charging and discharging of the capacitor is fixed, therefore the time of the electric potential of the capacitor is fixed for reach to the fixed voltage source, and the sequence of the output signal of the comparator is also fixed. In the above description, the fixed delay unit generates the fixed frequency.

2 Claims, 4 Drawing Sheets

STABLE FREQUENCY CLOCK GENERATOR

CROSS-REFERENCE TO RELATED APPLICATION

This application claims the priority benefit of Taiwan application Ser. No. 89124859, filed Nov. 23, 2000.

BACKGROUND OF THE INVENTION

1. Field of Invention

The present invention relates to a clock generator. More particularly, the present invention relates to a stable frequency clock generator without been affected by the variation of driving voltage.

2. Description of Related Art

A charge pump circuit is always designed in a flash memory. A simple ring oscillator generates the clock signal of the charge pump circuit when a single VDD is provided. More particularly, the structure of the ring oscillator illustrated in FIG. 1 and is built with a NAND gate 10 and a number of inverters, for example, inverters 12 and 14. An input node, m, of the NAND gate 10 receives a clock signal, clken, and an output node ,Y, of the NAND gate 10 connects to an input node of the first inverter 12. The output node of the first inverter 12 connects to the input node of the second inverter 14, then the output node thereof directly outputs a new clock signal, clk, or the output node of the second inverter connects to a number of inverters and then output a new clock signal, clk. The output node of the last inverter, for example, say 14 is the last one, also connects to the other input node, n, of the NAND gate 10. This connection allows the new clock signal, clk, return to the NAND gate 10 and with the clock signal, clken, inputs to the NAND gate 10 at the same time and generates a ring-type structure.

However, this structure as mentioned above is only applicable if the variation of VDD is within the range of ±10%. If the VDD drops below the range, the clock frequency generated by the ring oscillator will also drop. In general, the clock frequency is inversely proportional to the VDD. For example, if the VDD value drops from 5v down to 3v, the frequency is reduced by 40%. Moreover, because the efficiency of the charge pump circuit is directly proportional to the clock frequency, therefore the efficiency of the charge pump circuit is decreased when the clock frequency is decreasing. Hence, the decreasing range becomes a major problem to maintain a stable output voltage when the charge pump circuit is used as a power source.

SUMMARY OF THE INVENTION

The invention provides a stable frequency clock generator that is directly to work out the problem of degraded stability of clock frequency caused by the decrease of VDD.

As embodied and broadly described herein, the invention provides a stable frequency clock generator, which includes a NAND gate, a number of fixed delay units and a number of inverters. More particularly, the NAND gate has a first and a second input nodes and an output node. The first input node receives an input clock signal. Each of the fixed delay units has an input node and an output node. Each inverter has an input node and an output node. Each inverter and the fixed delay unit are connected n series alternately and evenly. The input node of the first fixed delay unit connects to the output node of the NAND gate, and the output of the last inverter connects back to the second input node of the NAND gate for sending a stabilized clock signal as a feedback signal.

More particularly, the input node of the fixed delay unit receives an input signal and the output node sends an output signal. Each fixed delay unit is built with an inverter, a first fixed current source, a first switch controller, a second switch controller, a second fixed current source, a capacitor and a comparator.

In the foregoing description, the input node of the inverter receives an input signal. One node of the first fixed current source connects to a high voltage and the other node of the first fixed current source connects to one node of the first switch controller, which is turned on and off by the input signal. One node of the second switch controller connects to another node of the first switch controller, which is controlled by the output signal of the inverter. The second fixed current source connects the second switch and a low voltage, for example, the ground. One node of the capacitor connects join of the first and the second switch controllers, and the other node connects to the low voltage. The comparator has a first and a second input nodes and an output end. More particularly, the first input node connects to one node of the capacitor and the second input node connects to a fixed voltage source. The output node of the comparator outputs a comparative signal that becomes the output signal of the fixed delay unit.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
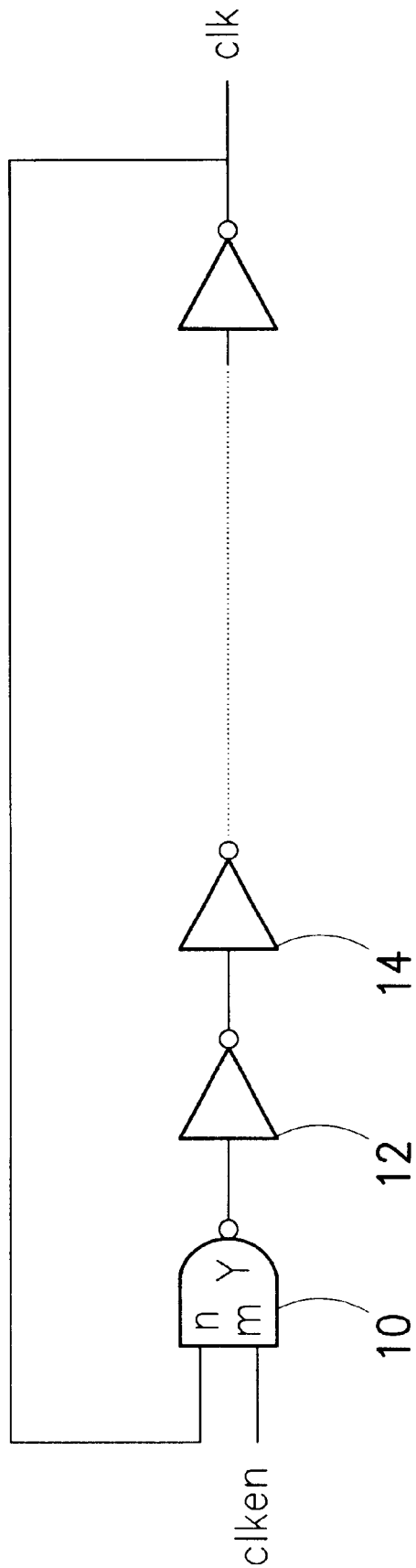
FIG. 1 is a structure diagram of a conventional ring oscillator.
Figure 2:
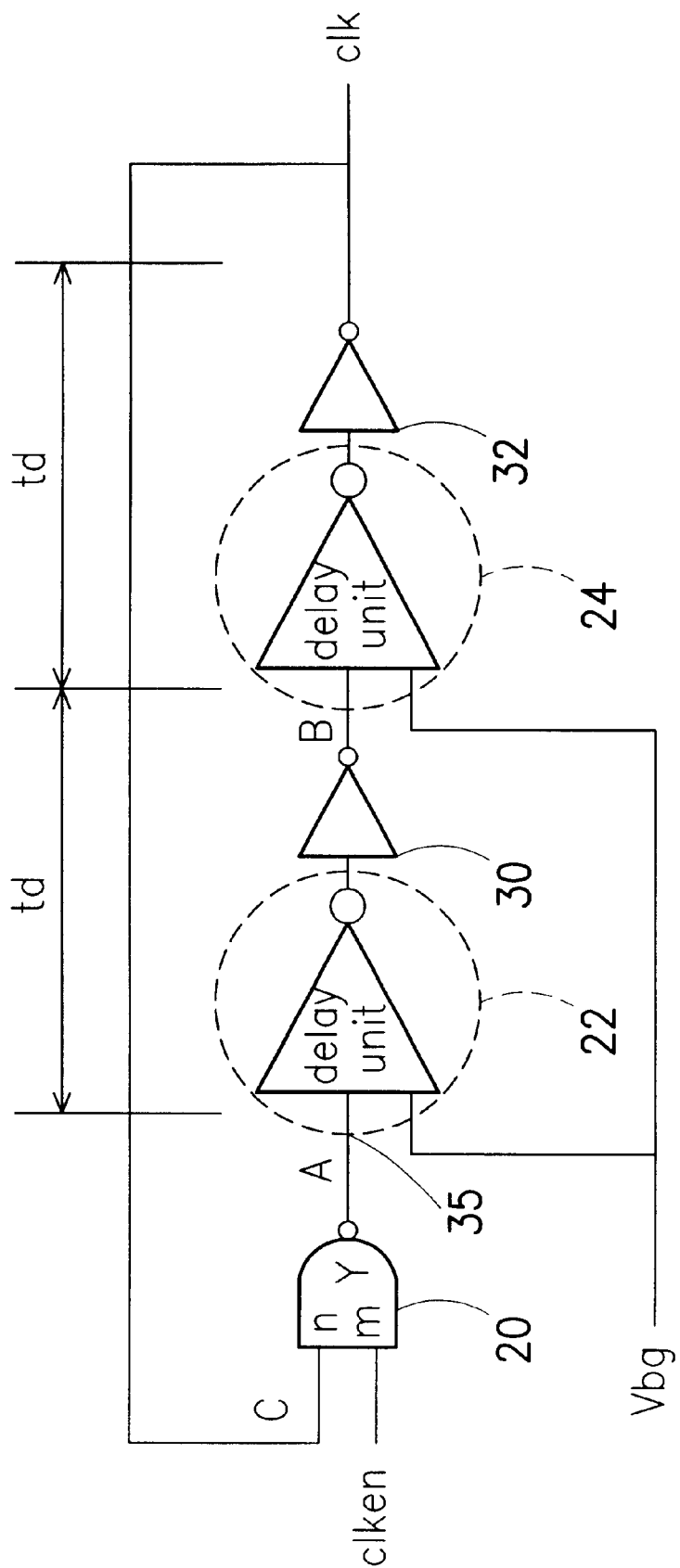
FIG. 2 is a stable frequency clock generator according to one preferred embodiment of this invention.

FIG. 2 illustrates a stable frequency clock generator according to one preferred embodiment of this invention.

In FIG. 2, the stable frequency clock generator includes a NAND gate 20, a number of the fixed delay units 22 and 24, and a number of the inverters 30 and 32. More particularly, the NAND gate 20 has a first input node, m, and a second input node, n, and an output node, Y. The first input node, m, receives an input clock signal, clken. Each fixed delay unit 22 and 24 has an input node and an output node respectively. The inverters 30 and 32 and the fixed delay units 22 and 24 are connected in series alternately and evenly. The number of the inverters equals to the number of the fixed delay units.

Figure 3:
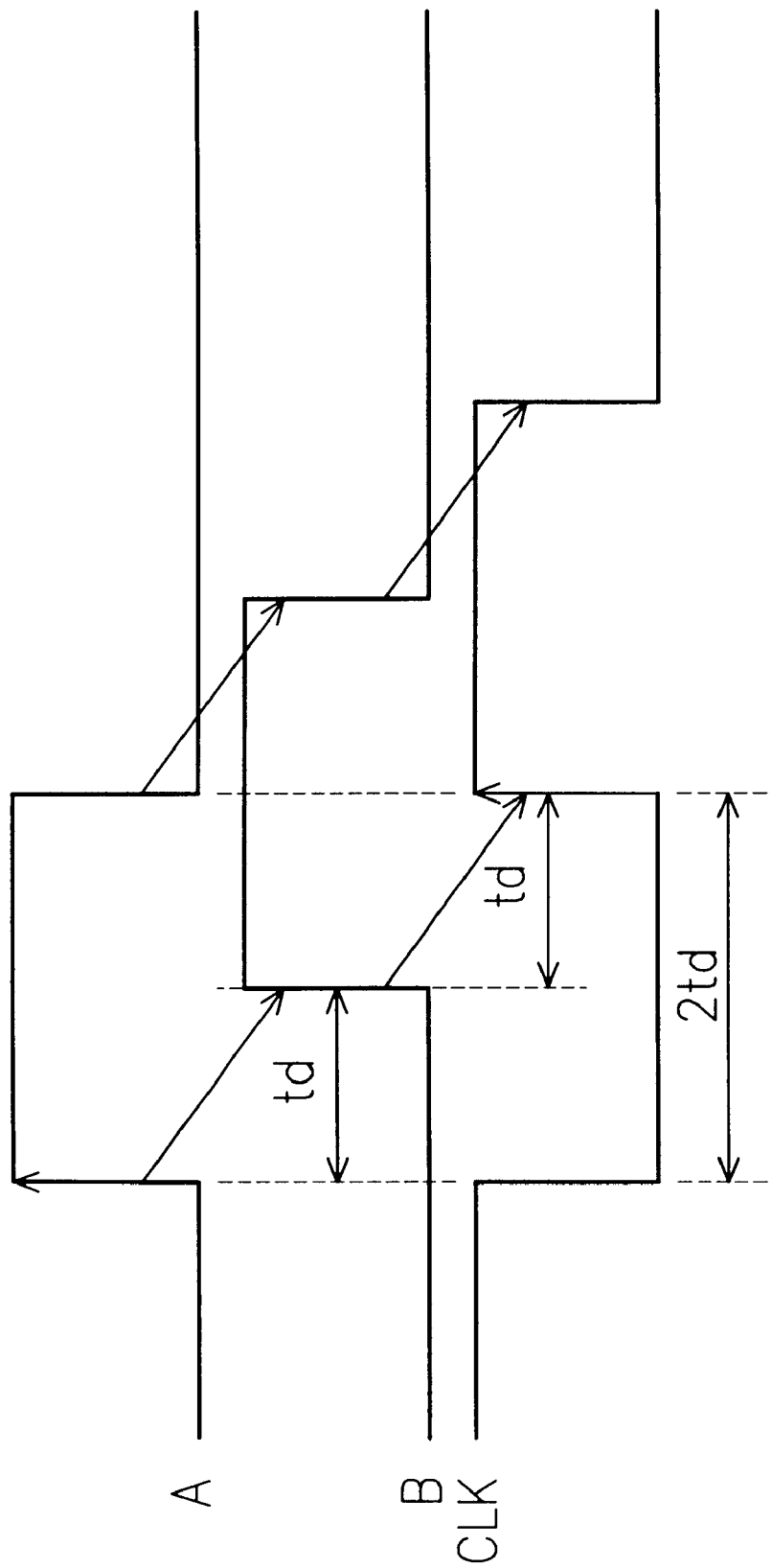
FIG. 3 is a sequence table showing the measurements on the node A, node B and node C according of FIG. 2.

In the above, the input node 35 of first fixed delay unit 22 is connected the output node, Y, of the NAND gate 20, and the output node of the fixed delay unit 22 and the input node of the inverter 30 are connected in series. The output node of the inverter 30 connects to the input node of the fixed delay unit 24, and the output node of the fixed delay unit 24 is connected to the input node of the inverter 32. The diagram is an example with two fixed delay units and two inverters. The output of the last inverter 32 is connected back to the second input node, n, of the NAND gate 20, and the output node of the inverter 32 sends a stabilized clock signal, clk., In FIG. 2, there are two fixed delay units and two inverters. The first set of the fixed delay unit 22 and the inverter 30 generates a time delay, td, while the second set of the fixed delay unit 24 and the inverter 32 also generates the same time delay, td. Therefore, the period is twice time delay, 2td, and the frequency is 1/2td, and the working period is 50%. For further describing the invention, the sequence table of the nodes A, B and C of FIG. 2 is shown in FIG. 3. More particularly, the node A is at the output node of the NAND gate 20. The node B is at the output node of the inverter 30. And the node C is at the second input node, n, of the NAND gate 20 that connects with the output node of the inverter 32. The signal from node A has a time delay td at node B, after passing through the first part of the fixed delay unit 22. Again, the signal from node B gains another time delay td at node C after passing through the second part of the fixed delay unit 24 and inverter 32. Now, the node C generates signal time delay, 2td, that is twice longer than the node A. Plus the output of the last inverter 32 connects back to the second input node, n, of the NAND gate 20, the output time of the node C becomes the high voltage and low voltage that is, 2td.

Figure 4:
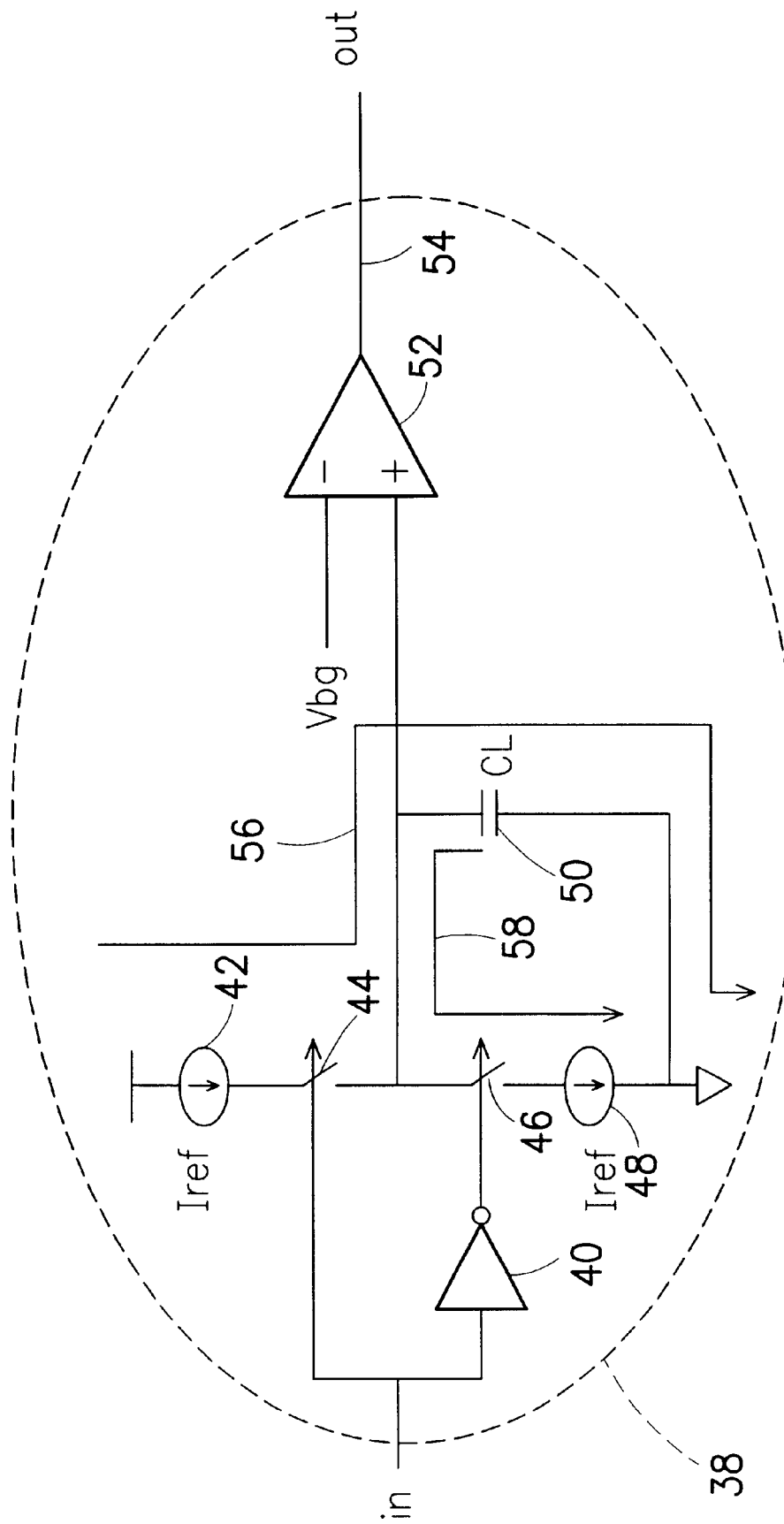
FIG. 4 is a structure diagram of a fixed delay unit.

FIG. 4 illustrates the structure of the fixed delay unit and further describes how to generate a fixed delay time, td. The fixed delay unit 38 includes an inverter 40, a first fixed current source 42, a first switch controller 44, a second switch controller 46, a second fixed current source 48, a capacitor 50 and a comparator 52. The input node of the fixed delay unit 39, In, and receives an input signal, and the output node, Out, outputs an output signal.

Firstly, the input node of the inverter 40 receives an input signal. One node of the first fixed current source 42 is connected to a high voltage, Vdd, and the other node is connected to the first switch controller 44. The input signal controls the first switch controller 44 whether conductive or not. One node of the second controller 46 is connected to the other node of the first switch controller 44. The inverter 40 controls the second controller 46 whether conductive or not. The second fixed current source 48 is connected between the second switch controller 46 and the low voltage, Vss. One node of the capacitor 50 is connected the switch controller between the first and the second switch controller 44 and 46, and another node of the capacitor 50 is connected to the low voltage, Vss, or the grounded voltage. And the comparator 52 has a first and a second input nodes. The first input node is connected to the capacitor 50 and the second input node is connected to a fixed voltage source, Vbg. The output node of the comparator 52 outputs a comparative signal 54 that is for the output signal of the fixed delay unit.

When the whole circuit is provided, the first switch controller 44 and the second switch controller 46 respectively receive the input signal and the inverse input signal at different time. The current goes through the high voltage, Vdd, the first fixed current source 42, the first switch controller 44, the capacitor 50 and the grounded node when the first controller 44 is closed. The first trace 56 is showing the track of the high voltage flows. In the other hand, when the second switch controller 46 is closed and the first switch controller 44 is opened, then the capacitor is discharged. The second trace 58 is showing the track of the current in the capacitor is discharged to the grounded node. The capacitor has a fixed time for charging and discharging, therefore the first input node of the comparator and the fixed voltage source, Vbg, of the second input node have the same sequence and the outputs of the comparative signal has a regular frequency.

Therefore, the fixed frequency clock generator in this invention is utilizing the capacitor of the fixed delay unit that has the fixed charging and discharging. The fixed frequency clock generator controls the signal of the fixed delay time that outputs from the comparator and it gets a signal of a fixed frequency.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A stable frequency clock generator, comprising:

a NAND gate, which comprises a first input node, a second input node and an output node, wherein the first input node receives an input clock signal;

a plurality of fixed delay units, wherein each of the fixed delay units comprises an input node, an output node; and a plurality of first inverters, each of the first inverters having an input node and an output node, wherein a number of the fixed delay units is same as a number of the first inverters, wherein the fixed delay units and the first inverters are connected in series alternately and evenly, and wherein the output node of the NAND gate is connected to the input node of a first one of the fixed delay units, and the output node of a last one of the first inverters is connected to the second input node of the NAND gate for sending a stabilized clock signal, wherein the input node of the fixed delay unit receives an input signal, and the output node outputs an output signal, and each of the fixed delay unit comprises:

a second inverter for receiving the input signal, a first fixed current source, which is connected to a high voltage source;

a first switch controller, wherein one node connects to another node of the first fixed current source and the input signal is controlled;

a second switch controller, wherein one node connects to another node of the first switch controller and the output of the second inverter is controlled;

a second fixed current source, which is connected between the second switch and a low voltage;

a capacitor, wherein one node connects to the connecting node between the first and second switch controllers, and other node connects to the low voltage; and a comparator, which has a first input node and a second input node, wherein the first input node connects to an node of the capacitor, and the second input node connects to a fixed voltage source, and the output node outputs a comparative signal for the output signal of the fixed delay unit.

2. The stable frequency clock generator claimed as claim 1, wherein the low voltage is a grounded voltage.

* * * * *